United States Patent [19]

Mizuno et al.

[11] Patent Number: 5,696,401
[45] Date of Patent: Dec. 9, 1997

[54] SEMICONDUCTOR DEVICE AND METHOD OF FABRICATING THE SAME

[75] Inventors: Tomohisa Mizuno, Yokohama; Yoshiaki Asao, Kawasaki, both of Japan

[73] Assignee: Kabushiki Kaisha Toshiba, Kawasaki, Japan

[21] Appl. No.: 623,941

[22] Filed: Mar. 29, 1996

Related U.S. Application Data

[63] Continuation of Ser. No. 516,961, Aug. 18, 1995, abandoned, which is a continuation of Ser. No. 167,125, Dec. 16, 1993, abandoned, and a continuation of Ser. No. 885,441, May 20, 1992, abandoned.

[30] Foreign Application Priority Data

May 24, 1991 [JP] Japan ............ 3-118963

[51] Int. Cl.⁶ .......... H01L 29/76; H01L 29/54; H01L 31/062; H01L 31/113
[52] U.S. Cl. .......... 257/402; 257/344; 257/345
[58] Field of Search .......... 257/402, 408, 257/345, 344, 409

[56] References Cited

U.S. PATENT DOCUMENTS 4,729,001  3/1988  Haskell ................. 257/345

FOREIGN PATENT DOCUMENTS

| 52-26177 | 2/1977 | Japan . |
| 53-42232 | 11/1978 | Japan . |
| 53-91874 | 7/1980 | Japan . |
| 65-53972 | 3/1988 | Japan . |

OTHER PUBLICATIONS

Proceedings of the IEDM—International Electron Devices Meeting, "High Performance SOIMOSFET Using Ultra-Thin SQI Film", Makoto Yoshimi et al., pp. 640–643, Dec. 6–9, 1987.

Symp. VLSI Tech. Dig. "High Speed and Highly Reliable Trench MOSFET with Dual-Gate", T. Mizuno et al., pp. 23–24, 1988.

Tomohisa Mizuno et al., High Performance Shallow Junction Well Transistor (SJET) published in Symp. VLSI Tech. Dig. (1991) pp. 109–110.

*Primary Examiner*—Stephen Meier
*Attorney, Agent, or Firm*—Finnegan, Henderson, Farabow, Garrett & Dunner, L.L.P.

[57] ABSTRACT

An MOSFET has the essential feature lying in that the depths of well regions are different between a channel region and a diffusion region under a gate electrode to suppress charges in depletion layers. The MOSFET comprises a first well region which is formed in the channel region of a substrate below a gate electrode, and has a PN junction shallower than the sum of the width of a channel depletion layer formed by a voltage applied to the gate electrode and the width of a depletion layer formed by a substrate voltage of the substrate, and a second well region which is formed in source and drain regions to extend to the first well region, and has a PN junction deeper than the sum of the width of a depletion layer formed in the source or drain region and the width of a depletion layer formed in the first well region by the substrate voltage of the substrate.

9 Claims, 2 Drawing Sheets

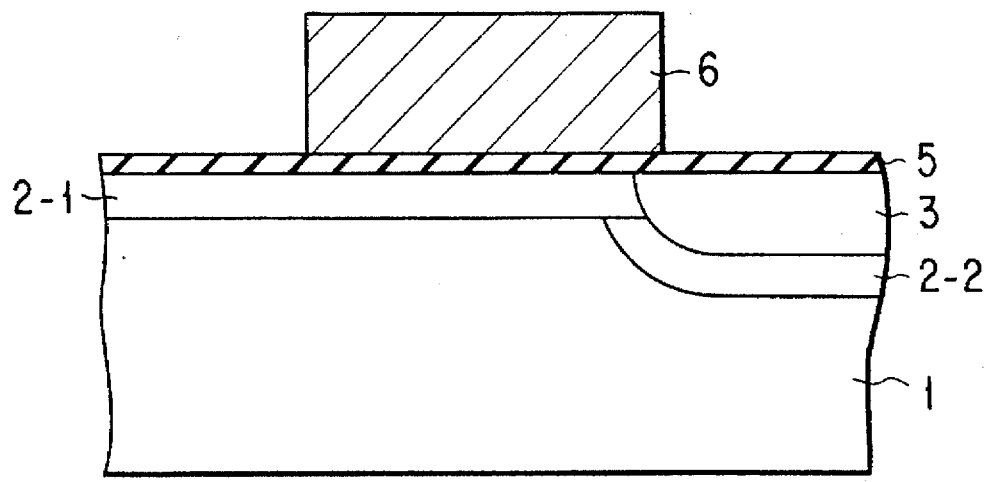
F I G. 4
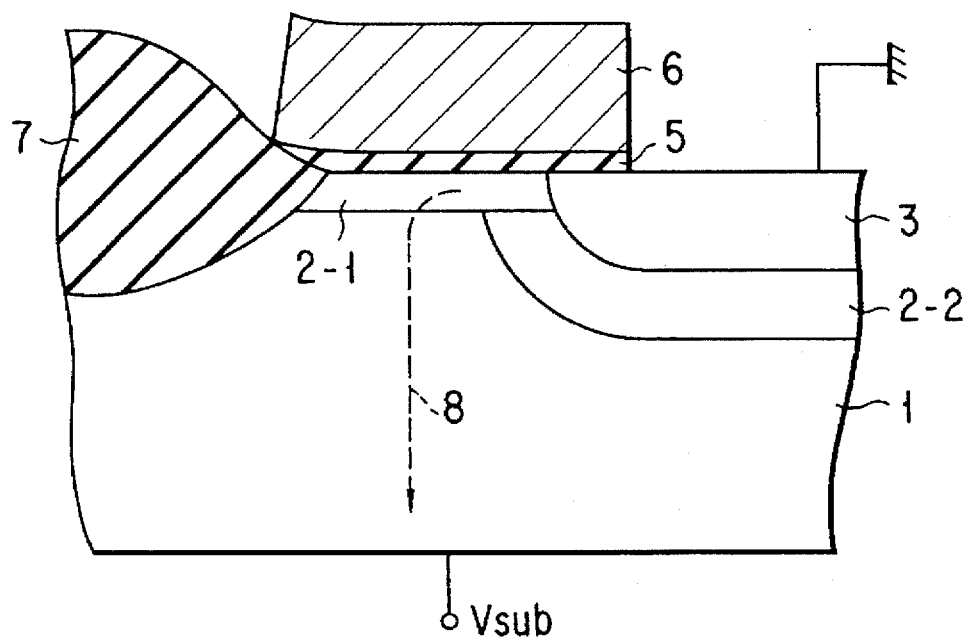
F I G. 5

SEMICONDUCTOR DEVICE AND METHOD OF FABRICATING THE SAME

This application is a continuation of application Ser. No. 08/516,961 filed Aug. 18, 1995, now abandoned, which is a continuation of application Ser. No. 08/167,125 filed Dec. 16, 1993, now abandoned, which is a continuation of Ser. No. 07/885,441 filed on May 20, 1992, now abandoned.

BACKGROUND OF THE INVENTION

1. Field of the Invention

The present invention relates to a semiconductor device of an MOS type and a method of fabricating the same.

2. Description of the Related Art

FIG. 1 is a cross section showing the structure of a conventional semiconductor device, i.e., an N-channel MOSFET. A gate oxide film 12 is formed on a P-type silicon substrate 11, and a gate electrode 13 is formed on the gate oxide film 12. An $N^+$-type source region 14 and an $N^+$-type drain region 15 are formed between the gate oxide film 12 and the surface of the substrate 11.

When a gate bias is applied to the above-structured MOSFET, a depletion layer is incurred in a channel region. Since charges in the depletion layer strengthen an effective gate electric field, mobility of carriers is reduced. Further, a gate electric field applied to an inversion layer is reduced, decreasing carrier density. As a result, the driving ability of the MOSFET will be lowered.

A so-called back gate bias effect, which increases a threshold value, increases when a substrate bias is applied to the MOSFET, and should also be considered.

As described above, the charge capacitance of the depletion layer of the channel region, of the conventional MOSFET adversely affects the improvement in the performance of an MOSFET, and deteriorates the driving ability of the MOSFET.

SUMMARY OF THE INVENTION

It is therefore an object of the present invention to provide a high-performance semiconductor device with an MOS structure, which does not have the above shortcoming and thus has a high driving ability and a method of fabricating the same.

A semiconductor device according to the present invention comprises a semiconductor substrate of a first conductivity type; a gate electrode formed on the semiconductor substrate with a thin insulating film sandwiched therebetween; a diffusion region of a first conductivity type formed on a surface of the semiconductor substrate to extend from a bottom edge of the gate electrode away from the gate electrode; a first semiconductor region of a second conductivity type, formed in a channel region in the semiconductor substrate below the gate electrode, and having a PN junction shallower than a sum of a width of a channel depletion layer formed in the channel region in the semiconductor substrate below the gate electrode by a voltage applied to the gate electrode and a width of a depletion layer formed by a substrate voltage of the semiconductor substrate; and a second semiconductor region of a second conductivity type formed in the diffusion region to extend into the first semiconductor region, and having a PN junction deeper than a sum of a width of a depletion layer formed in the diffusion region and a width of a depletion layer formed in the first semiconductor region by the substrate voltage of the semiconductor substrate.

A method of fabricating a semiconductor device according to the present invention comprises the steps of forming a first well region of a second conductivity type in a surface of a semiconductor substrate of a first conductivity type; forming a thin insulating film on the semiconductor substrate; forming a gate electrode on the insulating film; introducing an impurity of a first conductivity type in the surface of the semiconductor substrate using the gate electrode as a mask to form a diffusion region; and introducing an impurity of a second conductivity type using the gate electrode as a mask to form a second well region of a second conductivity type, surrounding the diffusion region, so as to extend into the first well region.

According to the present invention, the depths of the well regions are different between the channel region below the gate electrode and the diffusion region. For instance, the well regions are made deep in the diffusion layers of the source and drain and shallow in the channel region. Further, the well regions in the channel regions is made shallower than the sum of the width of the gate depletion layer and the width of the well-substrate depletion layer. The ion density of the channel region is lower than that of the diffusion layer, thereby suppressing the charges in the depletion layers of the MOSFET.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a cross section illustrating the structure of a semiconductor device according to another embodiment of the present invention; and FIG. 5 is a cross-sectional view showing the structure of a modification of the semiconductor device shown in FIG. 4.

DETAILED DESCRIPTION OF THE PREFERRED EMBODIMENTS

Preferred embodiments of the present invention will now be described referring to the accompanying drawings.

Figure 1:
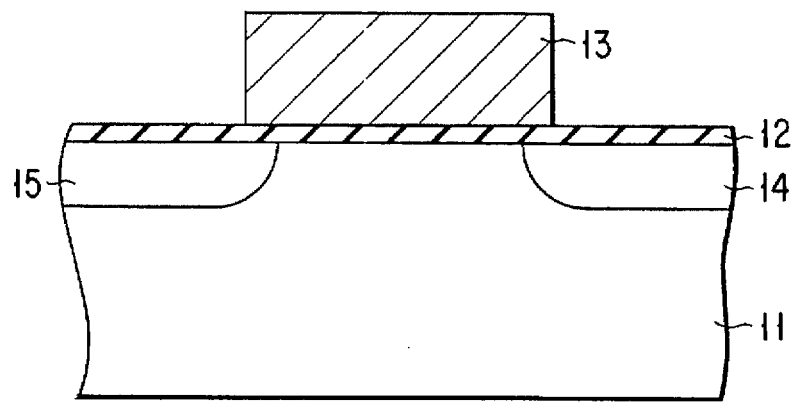
FIG. 1 is a cross section showing the structure of a conventional semiconductor device.
Figure 2:
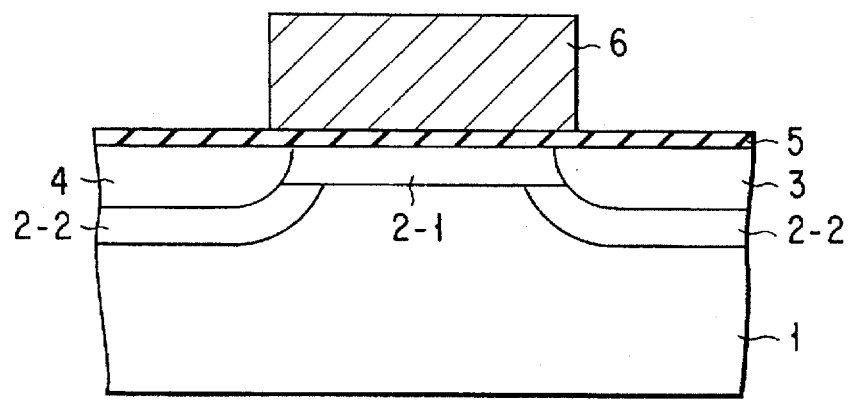
FIG. 2 is a cross-sectional view of the structure of a semiconductor device according to one embodiment of the present invention.

FIG. 2 is a cross section of the structure of an N-channel MOSFET according to one embodiment of the present invention. First and second P-type well regions 2-1 and 2-2 are formed in the surface of an N-type silicon substrate. The first well region 2-1 is provided along a channel region. The second well region 2-2 extends from the first well region 2-1 to surround a source region 3 and a drain region 4, both of an N type. A gate oxide film 5 is formed above the well regions 2-1 and 2-2, and a gate electrode 6 is formed on that portion of the gate oxide film 5 which lies above the channel region between the source region 3 and the drain region 4.

Given that the width of a channel depletion layer to be formed by a voltage applied to the gate electrode 6 is Wg, and the width of a depletion layer to be formed by a substrate voltage of the silicon substrate 1 is Ws, a depth Xjl of the first well region 2-1 satisfies the following relationship with Wg and Ws.

$$Xjl \leq Wg+Ws \quad (1)$$

Given that the width of a depletion layer to be formed between the source region 3 and drain region 4 is Wd, and the width of a depletion layer to be formed with a substrate voltage of the silicon substrate 1 is Ws, a depth Xj2 of the second well region 2-2 likewise satisfies the following relationship with Wd and Ws.

$$Xj2 > Wd+Ws \quad (2)$$

In this embodiment, since the depth Xjl of the first well region 2-1 formed in the channel region has a relationship with Wg and Ws as expressed by equation (1), charges of the channel depletion layer of the MOSFET fluctuate according to a voltage Vsub of the silicon substrate 1. In other words, as the voltage Vsub rises, the charges of the channel depletion layer decrease. The depth Xj2 of the second well region 2-2 has a relationship with Wd and Ws as represented by equation (2), so that a punch-through phenomenon will not occur between the source and drain regions 3 and 4 and the silicon substrate 1. Using the same mechanism as a thin film SOI-MOSFET TDMOS described in TEDM Tech. Dig., P. 640 (1987) by M. Yoshimi, K. Kato and H. Tango, and TDMOS described in Symp. VLSI Tech. Dig., P. 23 (1988) by T. Mizuno, T. Higuchi, Y. Saitoh, S. Sawada and S. Shinozaki, the reduction of the substrate bias effect can be expected while accomplishing high driving ability of an MOSFET, improved S-swing and the desired value for the threshold voltage Vth.

An example of a method for fabricating an MOSFET with the above-structure will now be described.

Figure 3:
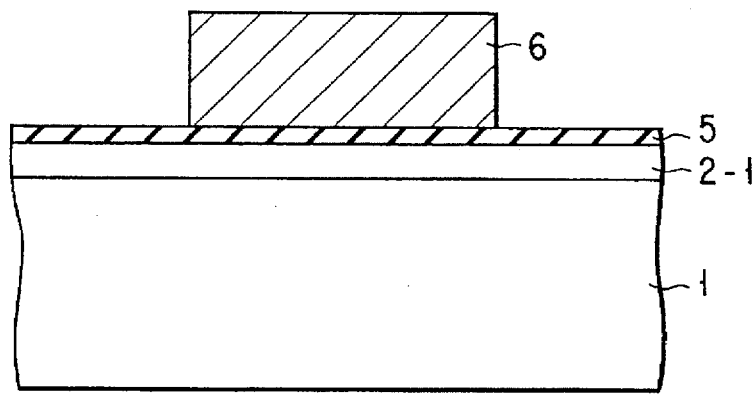
FIG. 3 is a cross-sectional view showing part of the procedures of fabricating the structure shown in FIG. 2.

As shown in FIG. 3, $B^+$ ions are injected in the surface of the N-type silicon substrate 1 having an impurity concentration of $5 \times 10^{16}$ cm to form the first well region 2-1 of a P type with the depth of about 150 nm and the impurity density of $1 \times 10^{17}$ cm$^{-3}$. Then the gate oxide film 5 is formed 15 nm thick on the substrate 1, and an impurity-containing polysilicon layer is formed on the gate oxide film 5. The polysilicon layer is patterned to form a gate electrode 6. The depth of the first well region 2-1 may differ from 150 nm as long as its impurity density is $1 \times 10^{17}$ cm$^{-3}$ and the relation expressed by equation (1) is satisfied.

With the gate electrode as a mask, $As^+$ ions are injected to form diffusion layers 3 and 4 having an impurity density of $1 \times 10^{20}$ cm$^{-3}$, which serve as a source and drain, respectively. Then, an impurity with a high diffusion coefficient, for example, $B^+$, is ion-injected by high energy using the gate electrode 6 as a mask, and the second well region 2-2 with its impurity density of $1 \times 10^{18}$ cm$^{-3}$ is formed, extending to the first well region 2-1 so as to surround the diffusion regions 3 and 4 (see FIG. 2). The depths of the source and the drain can take any values as long as the impurity densities are $1 \times 10^{20}$ cm$^{-3}$ and the relation represented by equation (2) is satisfied. The order of injecting $As^+$ and $B^+$ can be reversed. When the silicon substrate 1 is of a P type, the second well region 2-2 can be formed by injecting an N-type impurity with a high diffusion coefficient, such as $P^-$.

FIG. 4 illustrates the structure of an MOS type semiconductor device according to another embodiment, which does not have the drain region 4, unlike the device shown in FIG. 2. The source region 3 is grounded and the substrate 1 is used as a drain due to the substrate bias. When electrons are injected from an inversion layer in the channel region to the substrate, this semiconductor device is activated. Since only one diffusion layer, i.e., the source region 3, is formed, transistor operation free of a short channel effect is possible even with a smaller gate and a shorter channel.

FIG. 5 is a cross section showing a modification of the semiconductor device in FIG. 4. A transistor with the structure shown in FIG. 4 is formed adjacent to a field oxide film 7. The operation of the modified structure is the same as that of the structure shown in FIG. 4. The transistor is designed such that the source region 3 is grounded, and the substrate 1 serves as a drain due to a substrate bias Vsub, rendering the transistor conductive in the vertical direction as indicated by a broken line arrow 8 in FIG. 5.

More specifically, when a gate voltage to be applied to the gate electrode 6 is raised, an inversion layer is formed on the surface of the silicon substrate 1, i.e., on the surface of the first well region 2-1. If the substrate voltage Vsub rises to a certain degree, a bipolar transistor is formed as an equivalent circuit by the inversion layer, the first well region 2-1 and the silicon substrate 1, so that carriers in the inversion layer flow to the silicon substrate.

This operation can be accomplished in the transistor shown in FIG. 2 in the same manner as in the transistor structures shown in FIGS. 3 and 4, with both the source and drain grounded.

The N-type channel semiconductor device has been described in the foregoing description of the individual embodiments. The same advantages as obtained by these embodiments can be expected for a P-type channel semiconductor device in which the silicon substrate 1 is of a P type, the first and second well regions 2-1 and 2-2 of an N-type, and the source region 3 and the drain region 4 of a $P^+$ type.

As described above, the preset invention can provide a high-performance MOS semiconductor device with a high driving ability and a method of fabricating the same by setting the well regions in the channel portion shallower than the well regions of the diffusion portion of the source and drain and also shallower than the sum of the width of a gate depletion layer and the width of a well-substrate depletion layer.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor substrate of a first conductivity type;

an insulating film on said semiconductor substrate;

a gate electrode on said insulating film;

a diffusion region of a first conductivity type in a surface of said semiconductor substrate extending from a bottom edge of said insulating film away from said gate electrode and having a diffusion depth;

a first semiconductor region of a second conductivity type, in a channel region in said semiconductor substrate below said gate electrode and having a diffusion depth; and a second semiconductor region of a second conductivity type in said diffusion region extending into said first semiconductor region, having a diffusion depth, having an ion concentration higher than said first semiconductor region, and having a PN junction deeper than a sum of a width of a depletion layer in said diffusion region and a width of a depletion layer formed in said first semiconductor region by a substrate voltage of said semiconductor substrate;

wherein the diffusion depth of said first semiconductor region is less than the sum of the diffusion depths of said diffusion region and said second semiconductor region.

2. A semiconductor device according to claim 1, wherein a current flows vertically from said diffusion region to said semiconductor substrate below said gate electrode.

3. A semiconductor device according to claim 1, wherein a current flows transversally from said diffusion region to said bottom of said gate electrode on said opposite side through said channel region below said gate electrode.

4. A semiconductor device, comprising:

a semiconductor substrate of a first conductivity type;

an insulating film on the semiconductor substrate;

a gate on the insulating film, the gate defining a channel region in the semiconductor substrate;

a first well region of a second conductivity type extending from an edge of the insulation film below the gate into the channel region, the first well region having a diffusion depth;

a diffusion region of the first conductivity type extending from an edge of the insulation film into the semiconductor substrate adjacent to the first well region, the diffusion region having a diffusion depth; and a second well region of the second conductivity type having an ion concentration higher than the first well region, and extending from the diffusion region into the semiconductor substrate, the second well region having a diffusion depth;

wherein the diffusion depth of the first well region is less than the sum of the diffusion depths of the diffusion region and the second well region.

5. A semiconductor device according to claim 4, wherein the diffusion depth of the first well region is less than the diffusion depth of the diffusion region.

6. A semiconductor device according to claim 4, wherein the first well region has a PN junction shallower than a sum of a width of a channel depletion layer formed in the channel region by a voltage applied to the gate and a width of a depletion layer formed by a substrate voltage of the semiconductor substrate.

7. A semiconductor device according to claim 6, wherein the second well region has a PN junction deeper than a sum of a width of a depletion layer formed in the diffusion region and a width of a depletion layer formed in the first well region by the substrate voltage of the semiconductor substrate.

8. A semiconductor device according to claim 7, wherein a current flows vertically from the diffusion region to the semiconductor substrate below the gate.

9. A semiconductor device according to claim 7, wherein a current flows transversely from the diffusion region to the bottom of the gate on the opposite side through the channel region below the gate.

* * * * *